United States Patent
Kim et al.

(10) Patent No.: US 7,417,478 B2
(45) Date of Patent: Aug. 26, 2008

(54) DELAY LINE CIRCUIT

(75) Inventors: Kang Yong Kim, Boise, ID (US); Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 11/349,397

(22) Filed: Feb. 6, 2006

(65) Prior Publication Data

US 2007/0183227 A1   Aug. 9, 2007

(51) Int. Cl.
    *H03L 7/06* (2006.01)
(52) U.S. Cl. .................. 327/158; 327/161; 327/284; 327/286
(58) Field of Classification Search ................. 327/158, 327/161, 284, 286
    See application file for complete search history.

(56) References Cited

U.S. PATENT DOCUMENTS

| | | | | |
|---|---|---|---|---|
| 6,573,771 B2 * | 6/2003 | Lee et al. | ..................... | 327/158 |
| 6,774,691 B2 * | 8/2004 | Han et al. | ..................... | 327/158 |
| 6,781,861 B2 | 8/2004 | Gomm et al. | | |
| 6,812,760 B1 | 11/2004 | Kim et al. | | |
| 6,847,246 B1 * | 1/2005 | Kaviani et al. | ............... | 327/276 |
| 6,850,107 B2 * | 2/2005 | Gomm | ....................... | 327/277 |
| 6,873,199 B2 * | 3/2005 | Nishimura et al. | .......... | 327/279 |
| 6,879,200 B2 * | 4/2005 | Komura et al. | ............... | 327/278 |
| 6,895,522 B2 | 5/2005 | Johnson et al. | | |
| 7,049,873 B2 * | 5/2006 | Pilo et al. | .................... | 327/276 |

* cited by examiner

*Primary Examiner*—Kenneth B. Wells
(74) *Attorney, Agent, or Firm*—Brooks, Cameron & Huebsch, PLLC

(57) ABSTRACT

Methods, circuits, devices, and systems are provided, including a delay line for a delay-locked loop. One method includes providing a reference clock to a first delay unit in a delay line. The delay line includes a number of delay units coupled together. Even delay units, among the delay units, are coupled to an even clock line to generate a first intermediate clock. Odd delay units are coupled to an odd clock line to generate a second intermediate clock. The even and odd delay units are configured to in a manner intended to restrict an increase in drive to load ratio and to intrinsic delay as additional delay units are coupled to the number of delay units.

35 Claims, 4 Drawing Sheets

DELAY LINE CIRCUIT

TECHNICAL FIELD

The invention relates generally to integrated circuit memory devices, and more particularly, to synchronous circuits for the same.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically are synchronized to external operations. For example, commands are placed on a command bus of the memory device in synchronism with the external clock signal, and the memory device latches these commands at the proper times to successfully capture the commands. To latch the applied commands, an internal clock signal is developed in response to the external clock signal, and is applied to latches contained in the memory device to thereby clock the commands into the latches. The internal clock signal and external clock are synchronized to ensure the internal clock signal clocks the latches at the proper times to successfully capture the commands. In the example of FIG. 1, "external" is used to refer to signals and operations outside of the memory device, and "internal" to refer to signals and operations within the memory device. However, as the reader will appreciate, the principles described in the present disclosure are broadly applicable to aligning data output to a clock signal, external signals to input signals, etc. The present disclosure is directed to synchronous memory devices. However, as the reader will appreciate, the principles described herein are applicable to other types of synchronous integrated circuits.

Internal circuitry in the memory device that generates the internal clock signal introduces some time delay, causing the internal clock signal to be phase shifted relative to the external clock signal. As long as the phase-shift is small, timing within the memory device can be synchronized to the external timing. To increase the rate at which commands can be applied and at which data can be transferred to and from the memory device, the frequency of the external clock signal is increased, and in modern synchronous memories the frequency is in excess of 100 MHz. As the frequency of the external clock signal increases, however, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result, the commands applied to the memory device may no longer be valid by the time the internal clock signal clocks the latches.

To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another.

A DLL is a feedback circuit that operates to feed back a phase difference-related signal to control a delay line, until the timing of a first clock signal, e.g., the system clock, is advanced or delayed such that its rising edge is coincident (or "locked") with the rising edge of a second clock signal, e.g., the memory internal clock.

FIG. 1 illustrates a block diagram of a DLL 100. The DLL 100 receives a reference clock (RefCLK) 112 as an input and generates an output clock (CLKOut) signal 114 at its output. The CLKOut signal 114 is in turn fed back as a feedback clock signal (ClkFB or FB Clock) 116. The reference clock 112 can be the external system clock serving the system processor(s) or a delayed, buffered version of it. The system clock 112 may be supplied to the DLL 110 via one or more clock buffers (not shown).

The delay line in the DLL 100 can include a coarse delay line 118 and a fine delay line 120. The RefCLK 112 may be supplied first to the course delay line 118 whose output is then fed into the fine delay line 120 to generate the ClkOut signal 114. The coarse delay line 118 may include a number of coarse delay stages (not shown) and may be designed to produce an output signal having phase variation from an input signal within a coarse delay stage, whereas the fine delay line 120 is designed to produce an output signal having a phase variation from the input signal which is smaller than the deviation provided by the coarse delay line 118. In other words, the coarse delay line 118 is designed to bring its output signal to a near phase lock condition, or phase delayed condition, whereas the fine delay line 120 is designed to perform "fine tuning" to achieve the signal locking condition. Thus, a dual delay line (coarse and fine) DLL or PLL can provide a wide lock range while at the same time still providing a tight lock within reasonable time parameters.

In operation, the clock output signal 114 is used to provide the internal clock (not shown) used, for example, by memory device (not shown) to perform data read/write operations on memory cells (not shown) and to transfer the data out of the memory device to the data requesting device, e.g., a processor. As can be seen from FIG. 1, the ClkOut signal 114 (and, hence FBClock 116) is generated using delay lines 118, 120, which introduce a specific delay into the input RefClk 112 to obtain the "lock" condition.

As noted the purpose of the DLL 110 is to align or lock the internal clock (not shown) used by, for example, a memory device to perform data read/write operations to the system's external clock (not shown). A delay monitor 122 monitors a delay time of the output clock 114 from the coarse and fine delay lines 118, 120 to DQ output and a delay time of clock input buffer. A phase detector (PD) 124 compares the relative timing of the edges of the system's external clock and the memory's internal clock by comparing the relative timing of their respective representative signals, e.g., the RefClk 112 which relates to the system clock, and the FBClock signal 116 which relates to the memory's internal clock, so as to establish the lock condition. The PD 124 may compare a phase difference between the RefClk 112 and the FBClock 116 (supplied via the delay monitor) and output appropriate shift signals SHL (shift left) signal 125 and SHR (shift right) signal 126 for adjusting the phase difference between the RefClk 112 and the FBClock 116. The delay monitor circuit 122 may function as a buffer or dummy delay circuit for the ClkOut signal 114 before the ClkOut signal 114 is fed into the phase detector 124 as the FBClock 116. The output of the delay monitor 122, i.e., the FBClock 116, may effectively represent the memory's internal clock, which may be provided to various circuit elements in a memory device through the clock driver and data output stages (not shown). Thus, the delay monitor 122 attempts to maintain the phase relationship between the RefClk 112 and the FBClock 116 as close as possible to the phase relationship that exists between the external system clock and the memory's internal clock.

The RefClk 112 and the FBClk 116 are fed as inputs into the phase detector 124 for phase comparison. The output of the PD 124, e.g., one of the SHL 125 and SHR 126 signals, controls the amount of delay imparted to the RefClk 112 by the delay lines 118, 120. The SHL 125 and SHR 126 signals may determine whether the RefClk 112 should be shifted left (SHL) or shifted right (SHR) through the appropriate delay units in the delay lines 118, 120 so as to match the phases of the ReiCik 112 and the FBClock 116 to establish the lock condition. The SHL 125 and SHR 126 maybe supplied to the delay lines 118, 120 via shift register 128, which may control the delay time of the delay time of the delay lines 118, 120 according to the shift signals SHL and SHR from the phase detector 128. Based on the status of the SHL 125 and the SHR 126 signals input thereto, the shift register 128 may generate one or more delay adjustment signals 130 to carry out the left or right shift operations indicated by the phase detector 124. As is known in the art, a shift left operation in delay line results in adding a delay to the clock signal input thereto, whereas a shift right operation reduces the delay. The delay adjustment signals 130 essentially serve the same purpose as the SHL 125 or the SHR 126 signals, but their application to the coarse and fine delay lines 118, 120, respectively, is controlled by the shift register 128. The cumulative delay imparted to the RefClk 112 by the series-connected coarse and fine delay lines 118, 120, respectively, operates to adjust the time difference between the ClkOut signal 114 (as represented by FBClock 116) and the input RefClk 112 until they are aligned. The phase detector 124 generates the shift left (SHL) and shift right (SHR) signals depending on the detected phase difference or timing difference between the RefClk 112 and the FBClock 116, as is known in the art.

In the DLL 110 of FIG. 1, when the RefClk 112 is output from the coarse delay line 118 and input to the fine delay line 120, the switching at the boundary of coarse and fine delays may result in creation of jitters(s) or discontinuity in the final signal output from the fine delay line 120, i.e., the ClkOut signal 114. These clock perturbations may not be desirable, especially when an electronic device, e.g., a memory device is operated at significantly high clock frequencies, e.g., 800 MHz or higher. Furthermore, as reference clock frequencies increase, the DLL architecture in FIG. 1 may not be suitable to adequately control coarse shifting at such high frequencies, which may negatively affect the signal integrity of the ClkOut 114 and may also delay the establishment of a lock condition.

It is therefore desirable to devise a clock synchronization circuit that avoids output clock signal jitter at high frequencies and the also performs a smooth phase transition at the boundary of the coarse and fine delays. It is also desirable to have this synchronization circuit able to adequately control coarse shifting at higher clock frequencies without any limitations.

SUMMARY OF THE INVENTION

Embodiments of the present invention include methods, circuits, devices, and systems including synchronous circuits. One embodiment includes a coarse delay line having a number of delay units coupled together and to an even clock line and an odd clock line. The even delay units are coupled to the even clock line and odd delay units are coupled to the odd clock line to maintain a particular gate delay difference between the even and the odd clock lines. A phase mixer coupled to the even and the odd clock lines. The even and odd delay units are coupled to the even and odd clock lines in a configuration intended to restrict an increase to intrinsic delay as additional delay units are coupled to the number of delay units.

An operational method embodiment for producing a synchronized clock signal includes providing a reference clock to a first delay unit in a delay line having a number of delay units coupled together. The method of operation includes coupling even delay units, among the delay units, to an even clock line to generate a first intermediate clock, and coupling odd delay units, among the delay units, to an odd clock line to generate a second intermediate clock. The even and odd delay units are coupled to the even and odd clock lines in a configuration intended to restrict an increase in drive to load ratio and to intrinsic delay as additional delay units are coupled to the number of delay units.

A method embodiment for fabrication a number of even delay units, among the delay units, are coupled together through all like-type gates to form an even clock line and to generate a first intermediate clock. The number of odd delay units, among the delay units, are coupled together through all like-type gates to form an odd clock line and to generate a second intermediate clock. A phase mixer is coupled to the even clock line and the odd clock line. In one embodiment, the even and odd delay units are coupled to the even and odd clock lines in a configuration intended to restrict an increase to intrinsic delay as additional delay units are coupled to the number of delay units.

DETAILED DESCRIPTION

Methods, circuits, devices, and systems are provided, including a delay line for a synchronization circuit, e.g., a delay-locked loop. One method includes providing a reference clock to a first delay unit in a delay line. The delay line includes a number of delay units coupled together. Even delay units, among the delay units, are coupled to an even clock line to generate a first intermediate clock. Odd delay units are coupled to an odd clock line to generate a second intermediate clock. The even and odd delay units are coupled to the even and odd clock lines in a configuration intended to restrict an increase to intrinsic delay as additional delay units are coupled to the number of delay units.

In various embodiments, a delay line is provided which has an improved delay path over previous delay line paths. That is, the delay path may produce less intrinsic delay, less duty cycle distortion, and consume less power than previous delay path configurations.

Figure 2:
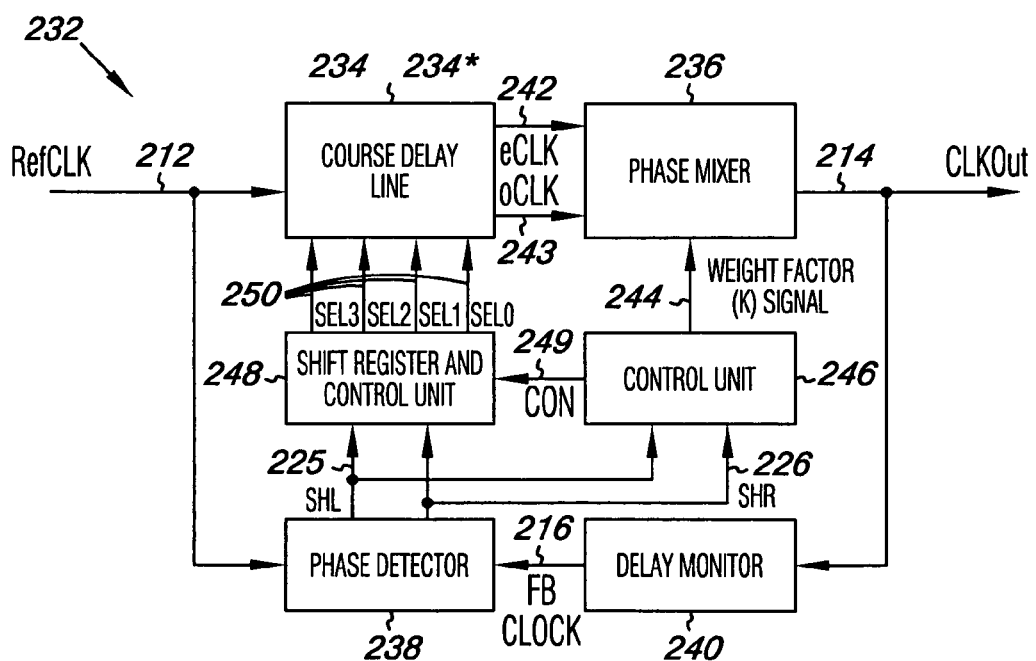
FIG. 2 illustrates a DLL circuit according to an embodiment of the present disclosure.

FIG. 2 illustrates a DLL circuit 232 according to an embodiment of the present disclosure. It is noted that the terms "coupled", "connected", "connecting", "electrically connected", etc., are used interchangeably herein to refer to the condition of being electrically connected. It is further noted that various block diagrams, circuit diagrams, etc. shown and discussed herein employ logic circuits that implement positive logic, i.e., a high value on a signal is treated as a logic "1" and a low value is treated as a logic "0". However, the embodiments discussed herein could alternatively be implemented in negative logic, i.e., a high value on a signal is treated as a logic "0" and a low value is treated as a logic "1". Additionally, the terms "synchronous circuit" or "synchronization circuit" are used interchangeably to refer to a clock synchronization circuit such as a delay locked loop (DLL) or a phase locked loop (PLL). In the description below reference is made to a DLL. However, as the reader will appreciate, the embodiments may equally be implemented in a circuit employing a PLL.

Figure 1:
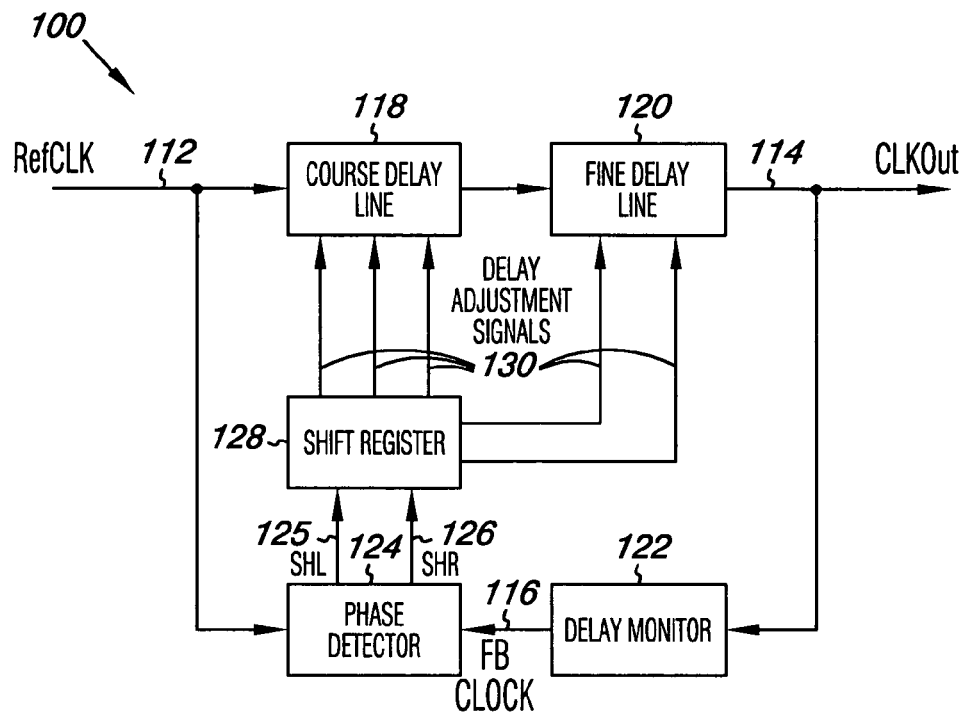
FIG. 1 illustrates a delay-locked loop (DLL) circuit according to the teachings of the prior art.

As shown in FIG. 2, the DLL circuit 232 includes a single delay line 234 in contrast to the dual delay line architecture shown in FIG. 1. In the embodiment of FIG. 2, the delay line 234 is illustrated as a coarse delay line 234 and described in more detail in connection with FIGS. 3 and 4. According to various embodiments the fine delay, e.g., 120 in FIG. 1, is accomplished using a digital phase mixer 236. The DLL circuit 232 also includes a phase detector 238 and a delay monitor 240. The operation of the phase detector 238 and the delay monitor 240 may be similar to the operation of the phase detector 124 and the delay monitor 122 shown and described in connection with FIG. 1. Likewise, in the DLL circuit 232 the operation of the various clock and shift signals may perform in a similar manner. For example, the RefCLK 112 in FIG. 1 corresponds to the RefCLK 212 in FIG. 2. The CLKOut shown in FIG. 1 is illustrated as 214 in FIG. 2. The SHL and SHR signals, 125 and 126 respectively in FIG. 1, are illustrated as SHL and SHR signals, 225 and 226 respectively in FIG. 2. The shift register 128 in FIG. 1 is illustrated as shift register 248 in FIG. 2.

In the embodiment of FIG. 2, the coarse delay line 234 is configured to generate two intermediate clock signals, shown as even clock signal (eCLK) 242 and odd clock signal (oCLK) 243, from the input RefCLK 212. According to embodiments, the eCLK signal 242 and the oCLK signal 243 have a fixed, e.g., predetermined, phase difference between them. More detail of the embodiments of the coarse delay line 234 is provided in connection with FIGS. 3 and 4. The phase mixer 236 mixes the phases of the eCLK signal 242 and the oCLK signal 243 according to a weight factor (K), and outputs the CLKOut signal 214 having a phase that is between the phases of the eCLK 242 and the oCLK 243. One example of the operation of the phase mixer 236 is provided in more detail in commonly assigned, copending United States patent application, entitled "Seamless Coarse and Fine Delay Structure for High Performance DLL", Ser. No. 11/186,548, filed on Jul. 21, 2005, which is incorporated herein in full by reference. As described in this copending application, the weight factor "K" may be supplied to the phase mixer 236 through a weight factor signal, shown as 244 in FIG. 2, generated by a control unit 246. The control unit 246 controls the operation of the phase mixer 236 by outputting the weight factor signal 244 in response to a shift indication signal, i.e., SHL 225 or SHR 226, received from the phase detector 238. As such, the weight factor signal 244 represents a phase shift operable to achieve "fine" tuning in the phase mixer 236. The weight factor signal 244 from the control unit 246 assures that the CLKOut 214 from the phase mixer 236 has a phase between the phases of the two delay clock signals, eCLK 242 and oCLK 243, input to the phase mixer 236 from the coarse delay line 234. In addition, the control unit 246 may also control the operation of the shift register 248 by outputting a control signal (CON) 249.

The shift register 248 may output shift select signals 250, shown as SEL0, SEL1, SEL2, SEL3, etc., to select which delay units in the coarse delay line 234 are selected to accomplish the desired left shift or right shift operation as indicated by the SHL 225 or SHR 226 signals from the phase detector 238. The shift register 248 may perform the generation of these shift select signals 250 based on the status of the control signal 249 received from the control unit 246 and the SHL 225 and SHR 226 signals from the phase detector 238. For example, when the phase difference between the FBClock 216 and the RefCLK 212 is over the delay time of one delay unit (described in more detail in FIGS. 3 and 4) in the coarse delay line 234, the control unit 246 and the phase detector 238 may instruct the shift register 248 via the control signal 249 and the SHL 225 and SHR 226 signals, respectively, to perform a shift operation by asserting appropriate shift select signals 250.

Thus, the DLL circuit 232 embodiment of FIG. 2 achieves synchronization between the RefCLK 212 and the FBClock 216 using just a single delay line 234 along with a phase mixer 236 and related phase detection, shifting and control circuitry. As discussed herein, the generation of two intermediate clocks 242, 243, in the delay line structure of FIG. 2, e.g., coarse delay line 234 followed by the fine delay structure of phase mixer 236, allows for coarse shifting at any time regardless of the reference clock's high/low value or frequency. Because the CLKOut 214 has a phase between the phases of the eCLK 242 and the oCLK 243 signals, a seamless transition at the coarse-fine boundary may be accomplished without introducing jitter at high frequency clock operations.

Figure 3:
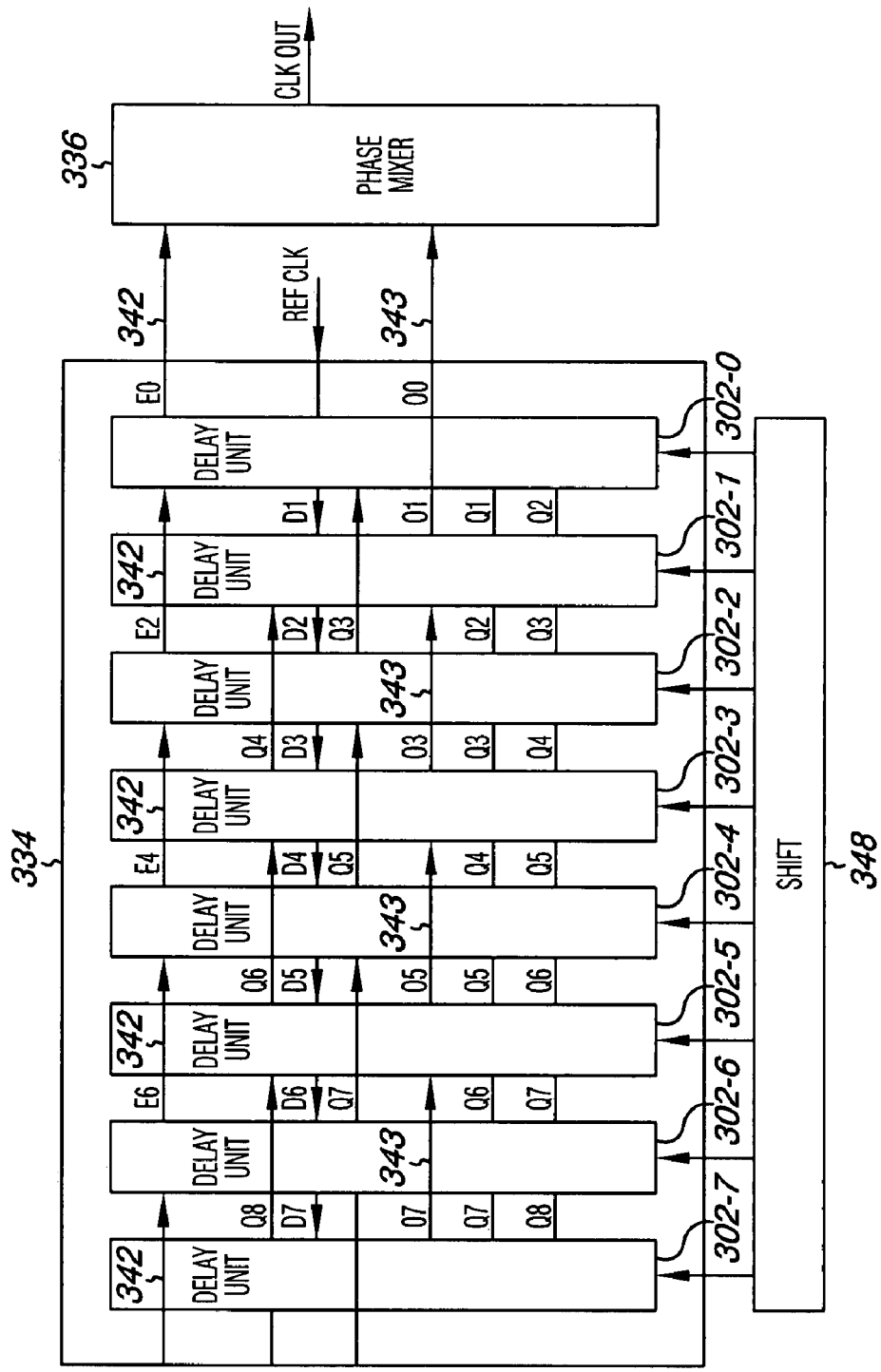
FIG. 3 illustrates a number of even delay units in a delay line coupled to an even clock line and a number of odd delay units in the delay line coupled to an odd clock line according to an embodiment of the present disclosure.

FIG. 3 illustrates in more detail a coarse delay line 334 coupled to a fine delay provided by a phase mixer 336 according to embodiments of the present disclosure. The coarse delay line 334 and phase mixer 336 can be implemented as the coarse delay line 234 and phase mixer 236 shown in FIG. 2. As shown in the embodiment of FIG. 3, the coarse delay line 334 includes a number of delay units, 302-0, 302-1, . . . , 302-7, etc., coupled together. Embodiments, however, are not limited to any particular number of delay units provided in the coarse delay line 334. Each of the delay units, 302-0, 302-1, . . . , 302-7, includes a number of delay gates, e.g., shown in FIG. 4. The delay units, 302-0, 302-1, . . . , 302-7, further include select logic (not shown) to receive select signals, e.g., 250 in FIG. 2, from the shift register 348. Shift register 348 can be implemented as the shift register 248 shown in FIG. 2. As the reader will appreciate, based on the select signals received to the delay units, 302-0, 302-1, . . . , 302-7, the delay units will share select logic signals, e.g., Q1, Q2, Q3, . . . , Q8 in FIG. 3, to activate particular select logic in the delay units, 302-0, 302-1, . . . , 302-7. For example, select logic signals Q1 and Q2 are illustrated being shared between first delay unit 302-0 and 302-1, select logic signals Q2 and Q3 are illustrated being shared between first delay unit 302-1 and 302-2, select logic signals Q3 and Q4 are illustrated being shared between first delay unit 302-2 and 302-3, etc. More detail on the operation of the same is not provided here so as not to obscure embodiments of the present disclosure.

FIG. 3 illustrates a number of even delay units, shown as 302-0, 302-2, 302-4, 302-6, etc., in the coarse delay line 334 coupled to an even clock line 342 to generate a first intermediate clock signal. The even clock line 342 represents eCLK 242 as shown in FIG. 2. FIG. 3 also illustrates a number of odd delay units, shown as 302-1, 302-3, 302-5, 302-7, etc., in the coarse delay line 334 coupled to an odd clock line 343 to generate a second intermediate clock signal. The odd clock line 342 represents oCLK 243 as shown in FIG. 2. According to various embodiments, the even and odd delay units, 302-0, 302-2, 302-4, 302-6, and 302-1, 302-3, 302-5, 302-7 respectively, are coupled to the even and odd clock lines, 342 and 343 respectively, in a configuration intended to restrict an increase in drive to load ratio and to intrinsic delay as additional delay units are coupled to the number of delay units.

As shown in FIG. 3, a reference clock input REFClk, such as RefCLK 212 shown in FIG. 2, is coupled to a first delay unit, e.g., 302-0, in the delay line 334. The input REFClk signal will propagate through the number of even and odd coupled delay units, 302-0, 302-1, 302-2, 302-3, etc., based on the select logic signals, e.g., Q1, Q2, Q3, . . . , Q8, provided from the shift register 348. As mentioned above, each of the delay units, 302-0, 302-1, 302-2, 302-3, etc., includes a number of logic gates (shown in more detail in FIG. 4) to apply a particular amount of delay to the input REFClk signal according to received select logic signals. The embodiment of FIG. 3 illustrates the input REFClk being propagated between delay units, 302-0, 302-1, 302-2, 302-3, etc., as D1, D2, D3, D4, D5, D6, D7, etc. Thus, in the embodiment of FIG. 3, D1 is the input REFClk signal propagated forward from even numbered delay unit 302-0 to odd numbered delay unit 302-1, D2 is the input REFClk signal propagated forward from odd numbered delay unit 302-1 to even numbered delay unit 302-2, D3 is the input REFClk signal propagated forward from even numbered delay unit 302-2 to odd numbered delay unit 302-3, D4 is the input REFClk signal propagated forward from odd numbered delay unit 302-3 to even numbered delay unit 302-4, D5 is the input REFClk signal propagated forward from even numbered delay unit 302-4 to odd numbered delay unit 302-5, D6 is the input REFClk signal propagated forward from odd numbered delay unit 302-5 to even numbered delay unit 302-6, D7 is the input REFClk signal propagated forward from even numbered delay unit 302-6 to odd numbered delay unit 302-7, etc. The input REFClk signal as it is propagated forward between the coupled delay units, 302-0, 302-1, 302-2, 302-3, etc., passes through a particular configuration of logic gates, as will be illustrated and discussed in more detail in connection with the embodiment of FIG. 4.

As illustrated in the embodiment of FIG. 3, each of the even numbered of delay units, 302-0, 302-2, 302-4, 302-6, etc., communicate logic signals back to the previous even numbered delay unit, 302-0, 302-2, 302-4, 302-6, etc., to indicate whether the particular even numbered delay unit has been activated according to received select logic signals provided by the shift register 348. Thus, the first non-selected even numbered delay unit will indicate such to the last selected even numbered delay unit. Likewise, each selected even numbered delay unit will similarly indicate this information back to the even numbered delay unit preceding it. In the embodiment of FIG. 3 this is illustrated by logic signal Q3 being communicated from even numbered delay unit 302-2 to even numbered delay unit 302-0, logic signal Q5 being communicated from even numbered delay unit 302-4 to even numbered delay unit 302-2, logic signal Q7 being communicated from even numbered delay unit 302-6 to even numbered delay unit 302-4, etc. According to embodiments and as will be illustrated in more detail in connection with FIG. 4, the first non-selected even numbered delay unit will provide a signal to the last selected even numbered delay unit to couple the propagated REFClk signal to the even clock line 342 to generate the first intermediate clock signal.

Also, according to embodiments and as will be illustrated in more detail in connection with FIG. 4, the coupled even clock line 342 only passes through a number of gates in the even numbered delay units, 302-0, 302-2, 302-4, 302-6, etc. This is illustrated in the embodiment of FIG. 3 as first intermediate clock signal path E0 on even clock line 342 coupling to phase mixer 336, first intermediate clock signal path E2 on even clock line 342 skipping logic gates in delay unit 302-1 in coupling between delay unit 302-2 and delay unit 302-0, first intermediate clock signal path E4 on even clock line 342 skipping logic gates in delay unit 302-3 in coupling between delay unit 302-4 and delay unit 302-2, first intermediate clock signal path E6 on even clock line 342 skipping logic gates in delay unit 302-5 in coupling between delay unit 302-6 and delay unit 302-4, etc.

Similarly, as illustrated in the embodiment of FIG. 3, each of the odd numbered of delay units, 302-1, 302-3, 302-5, 302-7, etc., communicate logic signals back to the previous odd numbered delay unit, 302-1, 302-3, 302-5, 302-7, etc., to indicate whether the particular odd numbered delay unit has been activated according to received select logic signals provided by the shift register 348. Thus, the first non-selected odd numbered delay unit will indicate such to the last selected odd numbered delay unit. Likewise, each selected odd numbered delay unit will similarly indicate this information back to the odd numbered delay unit preceding it. In the embodiment of FIG. 3 this is illustrated by logic signal Q4 being communicated from odd numbered delay unit 302-3 to odd numbered delay unit 302-1, logic signal Q6 being communicated from odd numbered delay unit 302-5 to odd numbered delay unit 302-3, logic signal Q8 being communicated from odd numbered delay unit 302-7 to odd numbered delay unit 302-5, etc. As the reader will appreciate the terms "odd" and "even" as used herein are intended to differentiate between alternating, connected delay units, 302-0, 302-1, 302-2, 302-3, etc., and between the even and odd clock lines, 342 and 343 respectively, for ease of illustration and discussion and are not intended to limit the scope of the various embodiments of the present disclosure.

According to embodiments and as will be illustrated in more detail in connection with FIG. 4, the first non-selected odd numbered delay unit will provide a signal to the last selected odd numbered delay unit to couple the propagated REFClk signal to the odd clock line 343 to generate the second intermediate clock signal. Also, according to embodiments and as will be illustrated in more detail in connection with FIG. 4, the coupled odd clock line 343 only passes through a number of gates in the odd numbered delay units, 302-1, 302-3, 302-5, 302-7, etc. This is illustrated in the embodiment of FIG. 3 as second intermediate clock signal path O3 on odd clock line 343 skipping logic gates in delay unit 302-2 in coupling between delay unit 302-3 and delay unit 302-1, second intermediate clock signal path O5 on odd clock line 343 skipping logic gates in delay unit 302-4 in coupling between delay unit 302-5 and delay unit 302-3, second intermediate clock signal path O7 on odd clock line 343 skipping logic gates in delay unit 302-6 in coupling between delay unit 302-7 and delay unit 302-5, etc. As will be discussed more detail in connection with the embodiment of FIG. 4, however, the second intermediate clock signal path may pass through a logic gate in even numbered delay unit 302-0 before coupling as second intermediate clock signal path O0 to the phase mixer 346.

Figure 4:
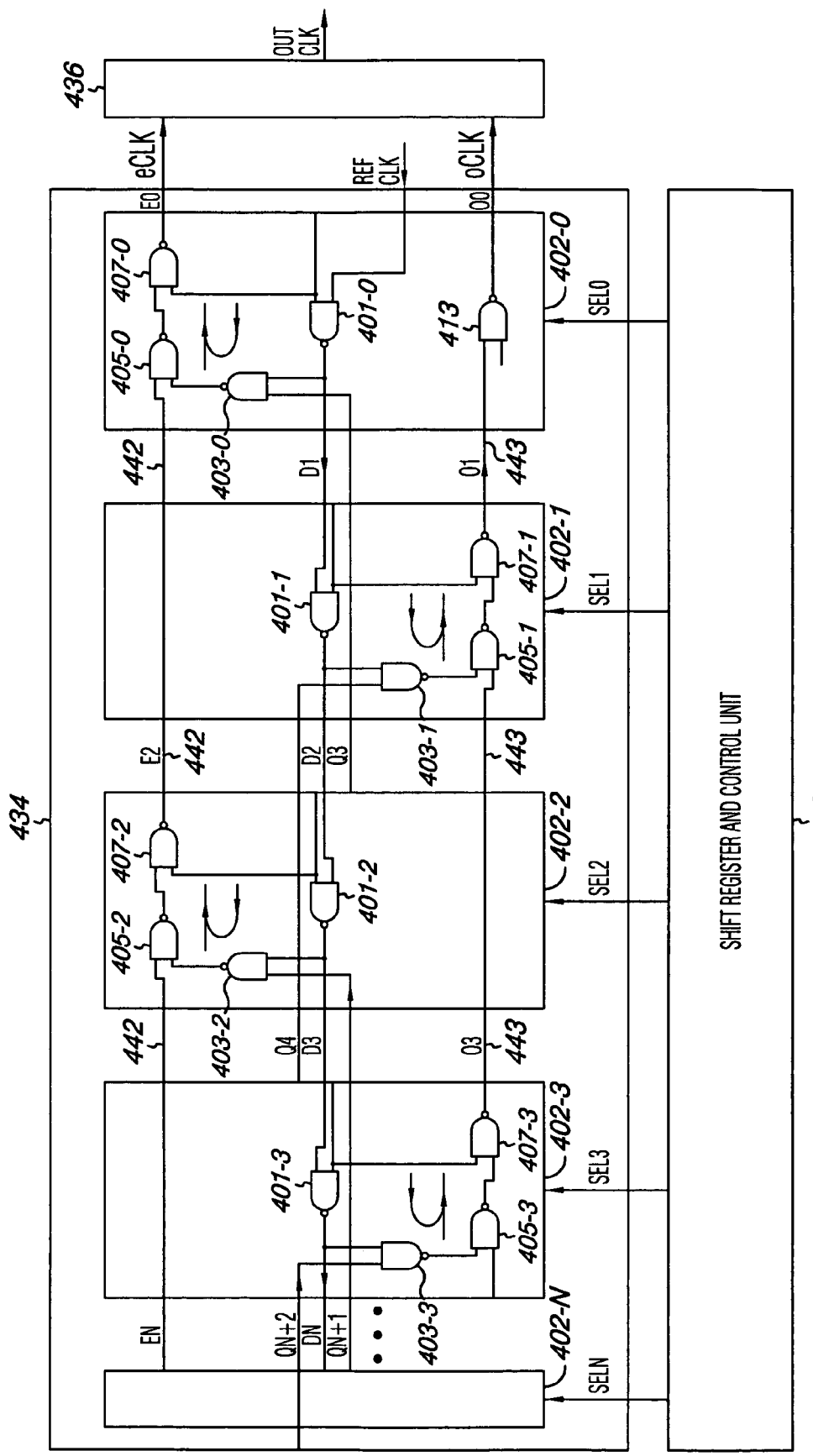
FIG. 4 illustrates an embodiment of a number of even delay units coupled to an even clock line through like-type gates and a number of odd delay units coupled to an odd clock line through like-type gates according to an embodiment of the present disclosure.

FIG. 4 illustrates in more detail an embodiment of the coarse delay line 434 coupling an even clock line 442 and an odd clock line 443 to a phase mixer 436 based on logic select signals, e.g., SEL0, SEL1, SEL2, . . . , SELN, received from a shift register 448. The designat or "N" to the above SELN is intended to represent that embodiments are not limited to the number of delay units included in a particular delay line implementation of the various embodiments of the present disclosure. As the reader will appreciate the coarse delay line 434, phase mixer 436, and shift register 448 can be implemented as the coarse delay line 334, phase mixer 336, and shift register 348 shown in FIG. 3.

The embodiment of FIG. 4 illustrates the even numbered delay units, 402-0, 402-2, 402-N, etc., coupled to the even clock line 442 through a particular number of like-type gates. In the embodiment of FIG. 4, even numbered delay units, 402-0, 402-2, 402-4, 402-6, etc. are each coupled to the even clock line 442 through four NAND gates. That is, even numbered delay unit 402-0 is illustrated as being coupled to the even clock line 442 through NAND gates 401-0, 403-0, 405-0, and 407-0. Likewise, even numbered delay unit 402-2 is illustrated as being coupled to the even clock line 442 through NAND gates 401-2, 403-2, 405-2, and 407-2. Embodiments, however, are not limited to implementation with NAND gates.

The embodiment of FIG. 4 illustrates of the odd numbered delay units, 402-1, 402-3, etc., coupled to the odd clock line 443 through a particular number of like-type gates. In the embodiment of FIG. 4, odd numbered delay units, 402-1, 402-3, etc. are each coupled to the odd clock line 443 through four NAND gates. That is, odd numbered delay unit 402-1 is illustrated as being coupled to the odd clock line 443 through NAND gates 401-1, 403-1, 405-1, and 407-1. Likewise, odd numbered delay unit 402-3 is illustrated as being coupled to the odd clock line 443 through NAND gates 401-3, 403-3, 405-3, and 407-3. Again, as mentioned in connection with the even clock line 442, embodiments are not limited to implementation with NAND gates.

As shown in the embodiment of FIG. 4, the even and odd delay units, 402-0, 402-2, 402-4, 402-6, and 402-1, 402-3, 402-5, 402-7 respectively, are coupled to the even and odd clock lines, 442 and 443 respectively in a configuration intended to restrict an increase in drive to load ratio and to intrinsic delay as additional delay units are coupled to the number of delay units.

In operation, the input REFClk signal is coupled to the first delay unit 402-0 in the delay line 434 at one of the inputs (i.e., a first input "A") to NAND gate 401-0. The other input (i.e., a second input "B") to NAND gate 401-0 is configured to receive a logic select signal, e.g., associated with logic select signal SEL0 received from the shift register 448. The reader will appreciate the operation of a NAND gate, read as NOT input A (first input) and B (second input) gives Q (output) to produce a logical output of a "1" or a "0" from the NAND gate based on two received input signals. It is noted that the signal which is input to the second input "B" is additionally provided to a second input "B" for NAND gate 407-0.

As shown in the embodiment of FIG. 4, the output from NAND gate 401-0 is provided as propagated input REFClk signal forward D1F to a second, e.g., first "odd", delay unit 402-1, among the alternating even and odd delay units 402-1, . . . , 402-N. In the second delay unit 402-1, the forward propagated input REFClk signal is provided at one of the inputs to NAND gate 401-1. The output from NAND gate 401-0 is additionally provided as a signal input at one of the inputs to NAND gate 403-0. As mentioned above, the input REFClk signal will propagate through the number of even and odd coupled delay units, 402-0, 402-1, 402-2, 402-3, etc., based on the select logic signals, e.g., SEL0, SEL1, SEL2, . . . , SELN, provided from the shift register 448. As shown in the embodiment of FIG. 4, and as described further below, each of the delay units, 402-0, 402-1, 402-2, 402-3, etc., includes a number of logic gates, e.g., in this embodiment 4 logic gates, to apply a particular amount of delay to the input REFClk signal as it is coupled to the even and odd clock lines, 442 and 443 respectively, from a particular even and odd numbered delay unit, 402-0, 402-2 and 402-1, 402-3 respectively, based on the logic select signals SEL0, SEL1, SEL2, . . . , SELN.

The embodiment of FIG. 4 again illustrates the input REFClk being propagated between delay units, 402-0, 402-1, 402-2, 402-3, etc., as D1, D2, D3, D4, D5, D6, D7, etc. Thus, in the embodiment of FIG. 4, D1 is the input REFClk signal propagated forward from even numbered delay unit 402-0 to odd numbered delay unit 402-1, D2 is the input REFClk signal propagated forward from odd numbered delay unit 402-1 to even numbered delay unit 402-2, D3 is the input REFClk signal propagated forward from even numbered delay unit 402-2 to odd numbered delay unit 402-3, DN is the input REFClk signal propagated forward from odd numbered delay unit 402-3 to even numbered delay unit 402-, etc.

As illustrated in the embodiment of FIG. 4, each of the even numbered of delay units, e.g., 402-2, communicates a logic signal back to the previous even numbered delay unit, e.g., 402-0, to indicate whether the particular even numbered delay unit has been activated according to received select logic signals provided by the shift register 448. Thus, as mentioned above, the first non-selected even numbered delay unit will indicate such to the last selected even numbered delay unit. Likewise, each selected even numbered delay unit will similarly indicate this information back to the even numbered delay unit preceding it. In the embodiment of FIG. 4 this is illustrated by logic signal Q3 being communicated from even numbered delay unit 402-2 to even numbered delay unit 402-0. As shown in the embodiment of FIG. 4, the Q3 signal is provided as an input signal at the other input to NAND gate 403-0. The Output of NAND gate 403-0 is provided at one input to NAND gate 405-0. The signal input to the other input of NAND gate 405-0 is received from the even clock line 442 coupled to the other even numbered delay units, e.g., signal path E2 received from even numbered delay unit 402-2. The output of NAND gate 405-0 is provided at the other input of NAND gate 407-0 to generate the first intermediate clock signal coupled back to a first input of the phase mixer 436 on the even clock line 442 (eCLK), e.g., via signal path EO. As the reader will appreciate, if even numbered delay unit 402-0 is the last selected even numbered delay unit the REFClk signal will have passed through four delay gates in delay unit 402-0 to generate the first intermediate clock signal returned to the phase mixer 436.

As mentioned above, the output from NAND gate 401-0 is provided as propagated input REFClk signal forward D1 to a second, e.g., first "odd", delay unit 402-1, among the alternating even and odd delay units 402-1, . . . , 402-N. In the second delay unit 402-1, the forward propagated input REFClk signal is provided at one of the inputs to NAND gate 401-1. The other input, e.g., second input, to NAND gate 401-1 is configured to receive a logic select signal, e.g., associated with logic select signal SEL1 received from the shift register 448. The output from NAND gate 401-1 is additionally provided as a signal input at one of the inputs to NAND gate 403-1. The embodiment of FIG. 4 again illustrates the input REFClk being propagated between delay units, 402-1, from the output of NAND gate 401-1, as D2 propagated forward to even numbered delay unit 402-2. The signal which is input to the other, e.g., second input, of NAND gate 401-1 is additionally provided to a second input for NAND gate 407-1.

As illustrated in the embodiment of FIG. 4, each of the odd numbered of delay units, e.g., 402-3, communicates a logic signal back to the previous odd numbered delay unit, e.g., 402-1, to indicate whether the particular odd numbered delay unit has been activated according to received select logic signals provided by the shift register 448. Thus, as mentioned above, the first non-selected odd numbered delay unit will indicate this state to the last selected odd numbered delay unit. Likewise, each selected odd numbered delay unit will similarly indicate this information back to the odd numbered delay unit preceding it. In the embodiment of FIG. 4 this is illustrated by logic signal Q4 being communicated from odd numbered delay unit 402-3 to odd numbered delay unit 402-1. As shown in the embodiment of FIG. 4, the Q4 signal is provided as an input signal at the other input to NAND gate 403-1. The Output of NAND gate 403-1 is provided at one input to NAND gate 405-1. The signal input to the other input of NAND gate 405-1 is received from the odd clock line 443 coupled to the other odd numbered delay units, e.g., signal path labeled O3 received from odd numbered delay unit 402-3. The output of NAND gate 405-1 is provided at the other input of NAND gate 407-1 to generate the second intermediate clock signal coupled back to the phase mixer 436 on the odd clock line 443 (oCLK), e.g., via signal path O1. As the reader will appreciate, if odd numbered delay unit 402-1 is the last selected odd numbered delay unit the REFClk signal will have passed through four delay gates in delay unit 402-1 to generate the second intermediate clock signal returned to the phase mixer 436.

As illustrated in the embodiment of FIG. 4, the first delay unit, e.g., even numbered delay unit 402-0 additionally includes a NAND gate 413 which receives at a first input the second intermediate clock signal carried on odd clock line 443. The other input of NAND gate 413 receives an input signal associated with the select logic signal SEL0 to generate the second intermediate clock signal coupled back to a second input of the phase mixer 436 on the odd clock line 443 (oCLK), e.g., via signal path O0. As the reader will appreciate, the embodiment illustrated in FIG. 4 thus maintains a two gate delay difference between the even and the odd clock lines. Embodiments, however, are not limited to the two gate delay example illustrated in FIG. 4.

As mentioned above, the output from NAND gate 401-1 is provided as propagated input REFClk signal D2 forward to a third, e.g., next "even", delay unit 402-2, among the alternating even and odd delay units 402-1, . . . , 402-N. In the next even numbered delay unit 402-3, the forward propagated input REFClk signal is provided at one of the inputs to NAND gate 401-2. The other input, e.g., second input, to NAND gate 401-2 is configured to receive a logic select signal, e.g., associated with logic select signal SEL2 received from the shift register 448. The output from NAND gate 401-2 is additionally provided as a signal input at one of the inputs to NAND gate 403-2. The embodiment of FIG. 4 again illustrates the input REFClk being propagated between delay unit, 402-2, from the output of NAND gate 401-2, as D3F propagated forward to odd numbered delay unit 402-3. The signal which is input to the other, e.g., second input, of NAND gate 401-2 is additionally provided to a second input for NAND gate 407-2.

As illustrated in the embodiment of FIG. 4, the subsequent, connected even numbered of delay unit, e.g., 402-N, communicates a logic signal back to even numbered delay unit, e.g., 402-2, to indicate whether the particular eve numbered delay unit has been activated according to received select logic signals provided by the shift register 448. Thus, as mentioned above, the first non-selected even numbered delay unit will indicate this state to the last selected even numbered delay unit. Likewise, each selected even numbered delay unit will similarly indicate this information back to the even numbered delay unit preceding it. In the embodiment of FIG. 4 this is illustrated by logic signal QN+1 being communicated from even numbered delay unit 402-N to even numbered delay unit 402-2. As shown in the embodiment of FIG. 4, the QN+1 signal is provided as an input signal at the other input to NAND gate 403-2. The Output of NAND gate 403-2 is provided at one input to NAND gate 405-2. The signal input to the other input of NAND gate 405-2 is received from the even clock line 442 coupled to the other even numbered delay units, e.g., signal path labeled EN received from even numbered delay unit 402-N. The output of NAND gate 405-2 is provided at the other input of NAND gate 407-2 to generate the first intermediate clock signal coupled back to the first input of the phase mixer 436 on the even clock line 442 (eCLK). Again, as the reader will appreciate, if even numbered delay unit 402-2 is the last selected even numbered delay unit the REFClk signal will have passed through four delay gates in delay unit 402-2 to generate the first intermediate clock signal returned to the phase mixer 436.

As mentioned above, the output from NAND gate 401-2 is provided as propagated input REFClk signal D3 forward to a next "odd" delay unit 402-3, among the alternating even and odd delay units 402-1, . . . , 402-N. In the next odd delay unit 402-3, the forward propagated input REFClk signal is provided at one of the inputs to NAND gate 401-3. The other input, e.g., second input, to NAND gate 401-3 is configured to receive a logic select signal, e.g., associated with logic select signal SEL3 received from the shift register 448. The output from NAND gate 401-3 is additionally provided as a signal input at one of the inputs to NAND gate 403-3. The embodiment of FIG. 4 again illustrates the input REFClk being propagated between delay unit, 402-3, from the output of NAND gate 401-3, as signal DN propagated forward to even numbered delay unit 402-N. The signal which is input to the other, e.g., second input, of NAND gate 401-3 is additionally provided to a second input for NAND gate 407-3.

As described above, each of the odd numbered of delay units, e.g., next odd numbered delay unit 402-N+1, communicates a logic signal back to the previous odd numbered delay unit, e.g., 402-3, to indicate whether the particular odd numbered delay unit has been activated according to received select logic signals provided by the shift register 448. Hence, in the embodiment of FIG. 4, a logic signal QN+2 is illustrated being communicated from odd numbered delay unit 402-N+1 to odd numbered delay unit 402-3. As shown in the embodiment of FIG. 4, the QN+2 signal is provided as an input signal at the other input to NAND gate 403-3. The Output of NAND gate 403-3 is provided at one input to NAND gate 405-3. The signal input to the other input of NAND gate 405-3 is received from the odd clock line 443 coupled to the other odd numbered delay units, e.g., signal path labeled ON+1 received from odd numbered delay unit 402-N+1 (not shown). The output of NAND gate 405-3 is provided at the other input of NAND gate 407-3 to generate the second intermediate clock signal coupled back to the phase mixer 436 on the odd clock line 443 (oCLK). As the reader will appreciate, if odd numbered delay unit 402-3 is the last selected odd numbered delay unit the REFClk signal will have passed through four delay gates in delay unit 402-3 to generate the second intermediate clock signal returned to the phase mixer 436.

From review of the example embodiment of FIG. 4, the reader will appreciate the manner in which the even and odd delay units, e.g., 402-0, 402-2 and 402-1, 402-3 respectively, are coupled to even and odd clock lines, 442 and 443 respectively, to generate a first and a second intermediate clock signal. The embodiments of the present disclosure achieve the same while maintaining a delay difference equal to a particular number of gates, a two gate delay difference in the embodiment of FIG. 4, between the even and the odd clock lines. The delay line embodiments described herein offer an improved delay path over previous delay line paths. That is, the delay path may produce less intrinsic delay, less duty cycle distortion, and consume less power than previous delay path configurations. As described in copending, commonly assigned United States patent application, entitled "Seamless Coarse and Fine Delay Structure for High Performance DLL", Ser. No. 11/186,548 (filed Jul. 21, 2005), the phase mixer 436 can then produce an output clock signal ("OUT CLK") from the first and the second intermediate clocks to provide fine tuning for the disclosed synchronizing circuit embodiments.

Figure 5:
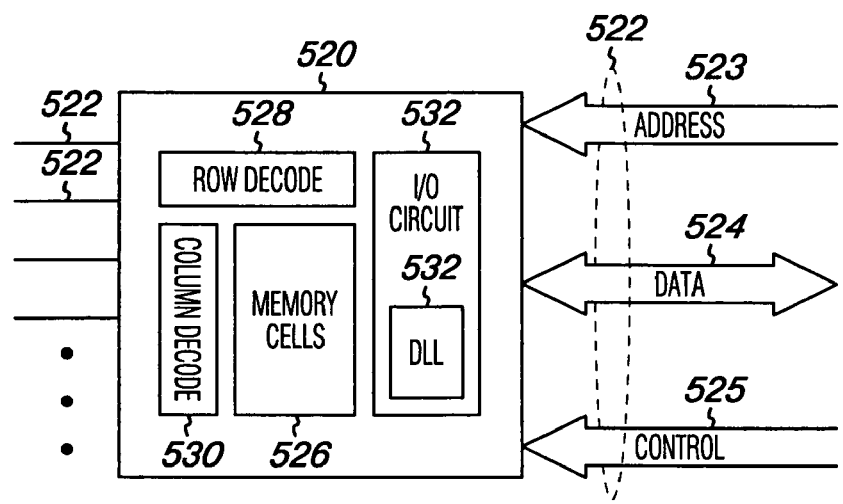
FIG. 5 illustrates a memory including a synchronization circuit in which a delay line according to various embodiments can be used.

FIG. 5 illustrates a memory chip or memory device 520 including a DLL circuit 532 in which a delay line according to various embodiments, e.g., 234, 334, 434 in FIGS. 2, 3, and 4, can be used. The memory 520 may be part of a DIMM (dual in-line memory module) or a PCB (printed circuit board) containing many such memory devices. The memory device 520 may include a number of pins 522 located outside of the chip 520 for electrically connecting the chip to other system devices. Some of those pins 522 may constitute memory address pins or address bus 523, data pins or data bus 524, and control pins or control bus 525. As the reader will appreciate, each of the reference numerals 523-525 designates more than one pin 522 in the corresponding bus and are broadly designated as such only for ease of illustration.

A processor or memory controller, shown below in FIG. 6, may communicate with the chip 520 and perform memory read/write operations. The processor and the memory chip 520 may communicate using address signals on the address lines or address bus 523, data signals on the data lines or data bus 524, and control signals, e.g., a row address strobe (RAS) signals, a column address strobe (CAS) signal, etc. on the control lines or control bus 525. As the reader will appreciate, the "width", i.e., number of pins of address, data, and control buses may differ from one memory configuration to another. Additionally, numerous peripheral devices or circuits may be provided along with the memory chip 520 for writing data to and reading data from the memory cells 526. However, such peripheral devices or circuits are not shown to provide a less cluttered illustration.

The memory chip 520 may include a number of memory arrays 526 having memory cells arranged in rows and columns to store data. Each memory cell may store one or more bits of data. A row decode circuit 528 and a column decode circuit 530 may select the rows and columns in the memory array 526 in response to decoding an address provided on the address bus 523. Data to and from the memory arrays 526 is then transferred over the data bus 524 via sense amplifiers and a data output path, as the same are know and understood. A memory controller, shown in FIG. 6, may provide relevant control signals on the control bus 525 to control data communication to and from the memory chip 520 via an I/O (input/output) circuit 532. The I/O circuit 532 may include a number of data output buffers, as the same are known, to received the data bits from the memory arrays 526 and provide those data bits or data signals to the corresponding data lines in the data bus 524. As noted above, the I/O circuit may include a clock synchronization or DLL circuit 532 having a delay line according to various embodiments, e.g., 234, 334, 434 in FIGS. 2, 3, and 4, to synchronize the external system clock, e.g., the clock used by the memory controller to clock address, data and control signals between the memory chip 520 and the controller or processor, with the internal clock used by the memory chip 520 to perform data write/read operation on the memory arrays 526.

Figure 6:
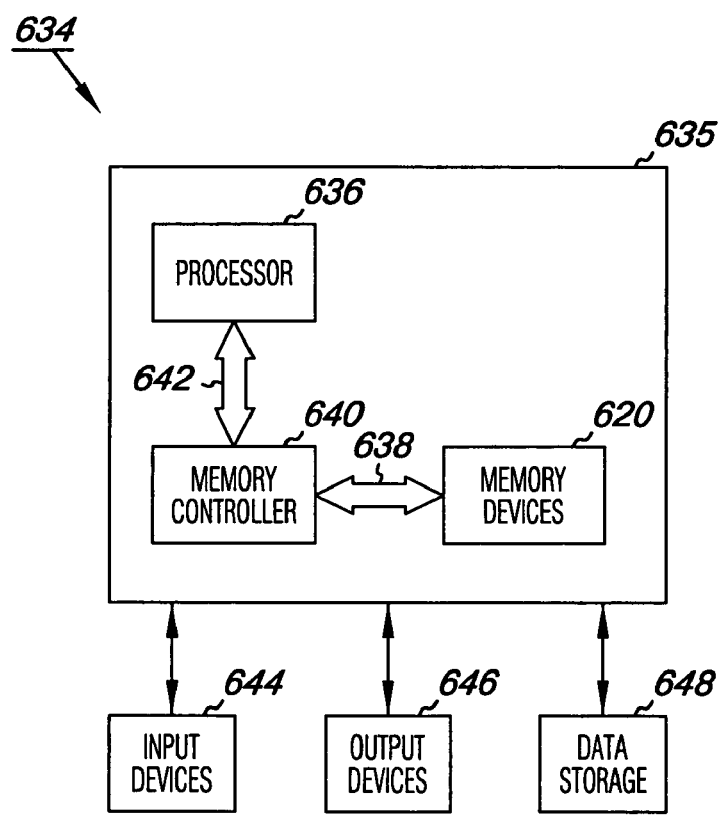
FIG. 6 illustrates a system having a memory in which a synchronization circuit having a delay line according to various embodiments can be used.

The memory controller, shown in FIG. 6, may determine the modes of operation of the memory chip 520. Some example of the input signals or control signals on the control bus 525 include and external clock signal, a chip select signal, a RAS signal, a CAS signal, a write enable signal, etc. The memory chip communicates to other devices connected thereto via the pins 522 on the chip 520. These pins, as mentioned above, may be connected to appropriate address, data, and control lines, 523, 524, and 525 respectively, to carry out data transfer, i.e., transmission and reception, operations.

FIG. 6 illustrates a system 634 having a memory 620 in which a delay-locked loop having a delay line according to various embodiments can be used. That is, FIG. 6 illustrates a system 634 in which one or more memory chips such as memory chip 520 in FIG. 5 may be used. For example, the system 634 may include a data processing unit or computing unit 635 that includes a processor 636 for performing various computing functions, such as executing specific software to perform particular calculations or data processing tasks. The computing unit 635 may also include memory devices 620 that are in communication with the processor 636 through a bus 638. The bus 638 may include and address bus, a data bus, and a control bus, such as described in connection with FIG. 5. The memory devices 629 can include dynamic random access memory (DRAM), static random access memory (SRAM), Flash memory, etc. The DRAM could be a synchronous DRAM, also referred to as synchronous graphics random access memory (SGRAM), SDRAM, SDRAM II, or double data rate SDRAM (DDR SDRAM), as well as Synchlink or Rambus DRAMs. A memory controller 640 controls data communication to and from the memory device 620 in response to control signals received from the processor over a bus 642. The memory controller 640 may include a command decode circuit, as the same are known. The command decode circuit may receive the input control signals, via bus 642, to determine the modes of operation of one or more memory devices 620 as described in connection with FIG. 5.

The system 634 may include one or more input devices 644, e.g., a keyboard, transceiver, mouse, etc., connected to the computing unit 635 to allow a user to input data, instructions, etc., to operate the computing unit 635. One or more output devices 646 connected to the computing unit 635 may also be provided as part of the system 634 to display or otherwise output data generated by the processor 636. Examples of output devices include printers, video terminals, monitors, display units, etc. The system 634 can also include one or more data storage devices 648 connected to the computing unit 635 to allow the processor 636 to store data in or retrieve data from internal or external storage media. Examples of data storage devices 648 include disk drives that accept hard and floppy disks, compact disk read only memories (CD-ROMs), compact disk read-write (CD-RW) memories, digital video disks (DVDs), etc.

Although specific embodiments have been illustrated and described herein, those of ordinary skill in the art will appreciate that an arrangement calculated to achieve the same results can be substituted for the specific embodiments shown. This disclosure is intended to cover all adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method of producing a clock signal, comprising:
   providing a reference clock to a first delay unit in a delay line circuit, wherein the delay line circuit includes a number of delay units coupled together;
   propagating the reference clock forward to a portion of the number of delay units;
   coupling even delay units, among the delay units, to an even clock line to generate a first intermediate clock;
   propagating the first intermediate clock back through the even delay units;
   coupling odd delay units, among the delay units, to an odd clock line to generate a second intermediate clock; and
   propagating the second intermediate clock back through the odd delay units.

2. The method of claim 1, wherein the method includes generating an output clock signal from the first and the second intermediate clocks.

3. The method of claim 1, wherein coupling even delay units to the even clock line includes coupling the even delay units though a number of NAND gates.

4. The method of claim 1, wherein coupling odd delay units to the odd clock line includes coupling the odd delay units though a number of NAND gates.

5. The method of claim 1, wherein coupling, even delay units to the even clock line includes coupling even delay units to the even clock line through all like-type gates.

6. The method of claim 1, wherein coupling odd delay units to the odd clock line includes coupling odd delay units to the odd clock line through all like-type gates.

7. A method of producing a clock signal, comprising:
   providing a reference clock to a first delay unit in a delay line circuit, wherein the delay line circuit includes a number of delay units coupled together;
   coupling even delay units to an even clock line;
   providing a signal from a non-selected even delay unit to a selected even delay unit coupled to the non-selected even delay unit to generate a first intermediate clock;
   coupling odd delay units to an odd clock line; and
   providing a signal from a non-selected odd delay unit to a selected odd delay unit coupled to the non-selected even delay unit to generate a second intermediate clock.

8. The method of claim 7, wherein the method includes coupling the even clock line and the odd clock line to a phase mixer.

9. The method of claim 7, wherein coupling even delay units to the even clock line includes coupling the even delay units through four NAND gates.

10. The method of claim 7, wherein coupling odd delay units to the odd clock line includes coupling the odd delay units through four NAND gates.

11. The method of claim 7, wherein the method includes maintaining a particular phase difference between the first and the second intermediate clocks.

12. The method of claim 7, wherein the method includes maintaining a two gate delay difference between the even and the odd clock lines.

13. A method for clock synchronization using a delay line circuit, comprising:
   coupling an even clock line signal through gates in even delay units among a number of delay units to generate a first intermediate clock from a reference clock signal, wherein coupling the even clock line signal through gates includes:
      coupling a reference clock and a select signal from a shift register to a first gate;
      coupling an output of the first gate and a logic signal from another even delay unit to a second gate;
      coupling an output of the second gate and the first intermediate clock to a third gate; and
      coupling an output of the third gate and the select signal to a fourth gate; and
   coupling an odd clock line signal through gates in odd delay units among the number of delay units to generate a second intermediate clock from the reference clock signal.

14. A delay line circuit, comprising:
   a number of delay units coupled together;
   a reference clock input coupled to a first delay unit in the delay line;
   a number of even delay units, among the delay units, coupled to an even clock line;
   a number of odd delay units, among the delay units, coupled to an odd clock line;
   a shift register with outputs to the number of delay units to select particular delay units;
   a non-selected even delay unit coupled to and providing a signal to a selected even delay unit to generate a first intermediate clock; and
   a non-selected odd delay unit coupled to and providing a signal to a selected odd delay unit to generate a second intermediate clock.

15. The circuit of claim 14, wherein the even clock line is coupled to a first input of a phase mixer and the odd clock line is coupled to a second input of the phase mixer.

16. The circuit of claim 15, wherein the phase mixer produces an output clock signal from the first and the second intermediate clocks.

17. The circuit of claim 14, wherein the even clock line couples the even delay units through a number of NAND gates.

18. The circuit of claim 14, wherein the odd clock line couples the odd delay units through a number of NAND gates.

19. The circuit of claim 14, wherein the even clock line couples the even delay units through all like-type gates.

20. The circuit of claim 14, wherein the odd clock line couples the odd delay units through all like-type gates.

21. A delay line circuit, comprising:
a number of delay units coupled together;
a reference clock input to a first delay unit in the delay line circuit;
a number of even delay units, among the delay units, coupled together through logic gates to form an even clock line and to generate a first intermediate clock;
a number of odd delay units, among the delay units, coupled together through logic gates to form an odd clock line and to generate a second intermediate clock, the odd delay units including:
  a reference clock and a select signal from a shift register coupled to a first logic gate;
  an output of the first logic gate and a logic signal from another odd delay unit coupled to a second logic gate;
  an output of the second logic gate and the second intermediate clock coupled to a third logic gate; and
  an output of the third logic gate and the select signal from the shift register coupled to a fourth logic gate; and
a phase mixer coupled to the even clock line and the odd clock line.

22. The circuit of claim 21, wherein each even delay unit is coupled to the even clock line through four NAND gates.

23. The circuit of claim 21, wherein each odd delay unit is coupled to the odd clock line through four NAND gates.

24. The circuit of claim 21, wherein the delay line is configured to maintain a two gate delay difference between the even and the odd clock lines.

25. A synchronization circuit, comprising:
a reference clock input to a first even delay unit in a coarse delay line circuit;
the course delay line circuit having an even clock line and an odd clock line, wherein even delay units are coupled to the even clock line running through the even delay units and odd delay units are coupled to the odd clock line running through the odd delay units; and
a phase mixer coupled to the even clock line via a gate in the first even delay unit and the odd clock line via a different rate in the first even delay unit to maintain a two rate delay difference between the even and the odd clock lines.

26. A method of forming a delay line circuit, comprising:
forming a number of delay units with each delay unit having a number of gates coupled together;
forming a first delay unit in the delay line circuit with a reference clock input;
forming an even clock line from coupling even delay units, among the delay units, to send a signal from a non-selected odd delay unit to a selected odd delay unit to generate a first intermediate clock; and
forming an odd clock line from coupling odd delay units, among the delay units, to send a signal from a non-selected odd delay unit to a selected odd delay unit to generate a second intermediate clock.

27. The method of claim 26, wherein forming the even clock line includes forming the even clock line to couple even delay units using one type of gate.

28. The method of claim 26, wherein forming the odd clock line includes forming the odd clock line to couple odd delay units using one type of gate.

29. The method of claim 26, wherein the method includes forming the even clock line and forming the odd clock line to maintain a two gate delay difference therebetween.

30. A memory device, comprising:
a memory array;
a row decoder coupled to the memory array;
a column decoder coupled to the memory array; and
an input/output (I/O) circuit coupled to the column decoder, wherein the I/O circuit includes a delay line circuit, the delay line circuit including:
  a number of delay units coupled together;
  a reference clock input to a first delay unit in the delay line circuit;
  a number of even delay units, among the delay units, coupled to an even clock line;
  a number of odd delay units, among the delay units, coupled to an odd clock line;
  a shift register with outputs to the number of delay units to select particular delay units;
  a non-selected even delay unit coupled to and providing a signal to a selected even delay unit to generate a first intermediate clock; and
  a non-selected odd delay unit coupled to and providing a signal to a selected odd delay unit to generate a second intermediate clock.

31. A memory device, comprising:
a memory array;
a row decoder coupled to the memory array;
a column decoder coupled to the memory array; and
an input/output (I/O) circuit coupled to the column decoder, wherein the I/O circuit includes a synchronization circuit, the synchronization circuit including:
  a reference clock input to a first even delay unit in a coarse delay line circuit;
  the course delay line circuit having an even clock line and an odd clock line, wherein even delay units are coupled to the even clock line running through the even delay units and odd delay units are coupled to the odd clock line running through the odd delay units; and
  a phase mixer coupled to the even clock line via a gate in the first even delay unit and the odd clock line via a different gate in the first even delay unit to maintain a two gate delay difference between the even and the odd clock lines.

32. A processor based system, comprising:
a data input device;
a data output device;
a processor coupled to the data input and output devices; and
a memory device coupled to the processor, wherein the memory device includes:
  a memory array;
  a row decoder coupled to the memory array;
  a column decoder coupled to the memory array; and
  an input/output (I/O) circuit coupled to the column decoder, wherein the I/O circuit includes a delay line circuit, the delay line circuit including:
    a number of delay units coupled together;
    a reference clock input to a first delay unit in the delay line circuit;
    a number of even delay units, among the delay units, coupled together to form an even clock line;
    a number of odd delay units, among the delay units, coupled together to form an odd clock line;
    a non-selected even delay unit coupled to and providing a signal to a selected even delay unit to generate a first intermediate clock;

a non-selected odd delay unit coupled to and providing a signal to a selected odd delay unit to generate a second intermediate clock; and a phase mixer coupled to the even clock line and the odd clock line.

33. The system of claim 32, wherein each even delay unit is coupled to form the even clock line using only one gate type.

34. The system of claim 33, wherein each odd delay unit is coupled to form the odd clock line through four NAND gates.

35. The system of claim 34, wherein the delay line circuit is configured to maintain a two gate delay difference between the even and the odd clock lines.

* * * * *

UNITED STATES PATENT AND TRADEMARK OFFICE
CERTIFICATE OF CORRECTION

PATENT NO. : 7,417,478 B2 Page 1 of 1
APPLICATION NO. : 11/349397
DATED : August 26, 2008
INVENTOR(S) : Kim et al.

It is certified that error appears in the above-identified patent and that said Letters Patent is hereby corrected as shown below:

In column 15, line 49, in Claim 3, delete "though" and insert -- through --, therefor.

In column 15, line 52, in Claim 4, delete "though" and insert -- through --, therefor.

In column 15, line 53, in Claim 5, delete "coupling," and insert -- coupling --, therefor.

In column 17, line 43, in Claim 25, before "in" delete "rate" and insert -- gate --, therefor.

In column 17, line 43, in Claim 25, after "two" delete "rate" and insert -- gate --, therefor.

Signed and Sealed this

Eleventh Day of November, 2008

JON W. DUDAS
*Director of the United States Patent and Trademark Office*